US012165989B2

(12) United States Patent
Chen et al.

(10) Patent No.: US 12,165,989 B2
(45) Date of Patent: *Dec. 10, 2024

(54) SEMICONDUCTOR PACKAGE WITH ELECTROMAGNETIC INTERFERENCE SHIELDING

(71) Applicant: Texas Instruments Incorporated, Dallas, TX (US)

(72) Inventors: Jie Chen, Plano, TX (US); Yiqi Tang, Allen, TX (US); Rajen Murugan, Dallas, TX (US); Liang Wan, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/295,192

(22) Filed: Apr. 3, 2023

(65) Prior Publication Data

US 2023/0245982 A1 Aug. 3, 2023

Related U.S. Application Data

(63) Continuation of application No. 17/246,115, filed on Apr. 30, 2021, now Pat. No. 11,621,232.

(51) Int. Cl.
*H01L 23/552* (2006.01)
*H01L 23/00* (2006.01)
*H01L 23/498* (2006.01)

(52) U.S. Cl.
CPC ...... *H01L 23/552* (2013.01); *H01L 23/49822* (2013.01); *H01L 24/19* (2013.01);
(Continued)

(58) Field of Classification Search
CPC . H01L 23/552; H01L 23/49822; H01L 24/19; H01L 24/20; H01L 24/32;
(Continued)

(56) References Cited

U.S. PATENT DOCUMENTS 6,515,870 B1 2/2003 Skinner et al.
11,621,232 B2 * 4/2023 Chen ................ H01L 24/19
257/659

(Continued)

*Primary Examiner* — Fernando L Toledo
*Assistant Examiner* — Neil R Prasad
(74) *Attorney, Agent, or Firm* — Yudong Kim; Frank D. Cimino

(57) ABSTRACT

A semiconductor package includes a multilayer package substrate including a first layer including a first dielectric and first metal layer including a first metal trace and a second layer including a second dielectric layer. An integrated circuit (IC) die includes bond pads, with a bottom side of the IC die attached to the first metal trace. Metal pillars are through the second dielectric layer connecting to the first metal trace. A third layer on the second layer includes a third dielectric layer on the second layer extending to a bottom side of the semiconductor package, and a second metal layer including second metal traces including inner second metal traces connected to the bond pads and outer second metal traces over the metal pillars, and filled vias providing externally accessible contact pads that connect the second metal traces to a bottom side of the semiconductor package.

23 Claims, 6 Drawing Sheets

(52) U.S. Cl.
CPC .............. *H01L 24/20* (2013.01); *H01L 24/32* (2013.01); *H01L 24/83* (2013.01); *H01L 2224/2101* (2013.01); *H01L 2224/32225* (2013.01); *H01L 2924/13091* (2013.01); *H01L 2924/14253* (2013.01); *H01L 2924/1426* (2013.01); *H01L 2924/3025* (2013.01)

(58) Field of Classification Search
CPC ............. H01L 24/83; H01L 2224/2101; H01L 2224/32225; H01L 2924/13091; H01L 2924/14253; H01L 2924/1426; H01L 2924/3025

See application file for complete search history.

(56) References Cited

U.S. PATENT DOCUMENTS

| | | |
|---|---|---|
| 2016/0351525 A1 | 12/2016 | Chun et al. |
| 2017/0034923 A1 | 2/2017 | Lin et al. |
| 2021/0160999 A1 | 5/2021 | Doglamis et al. |

\* cited by examiner

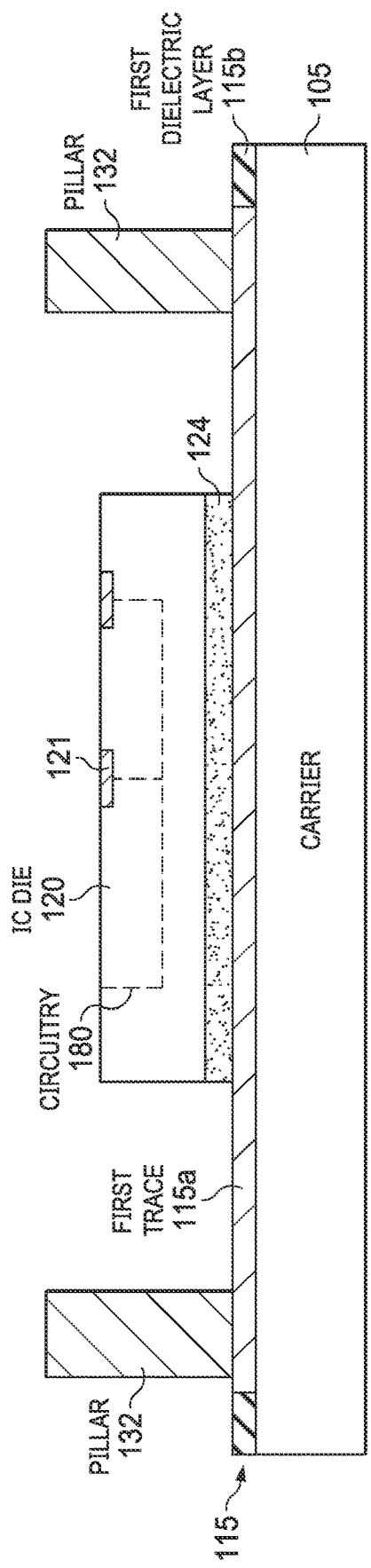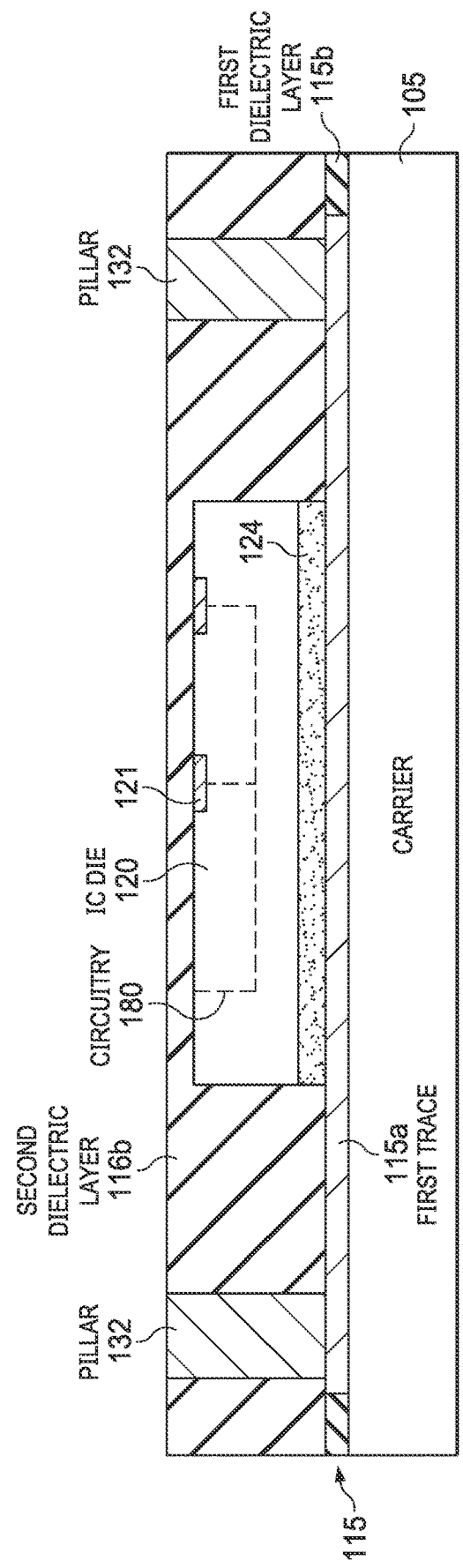

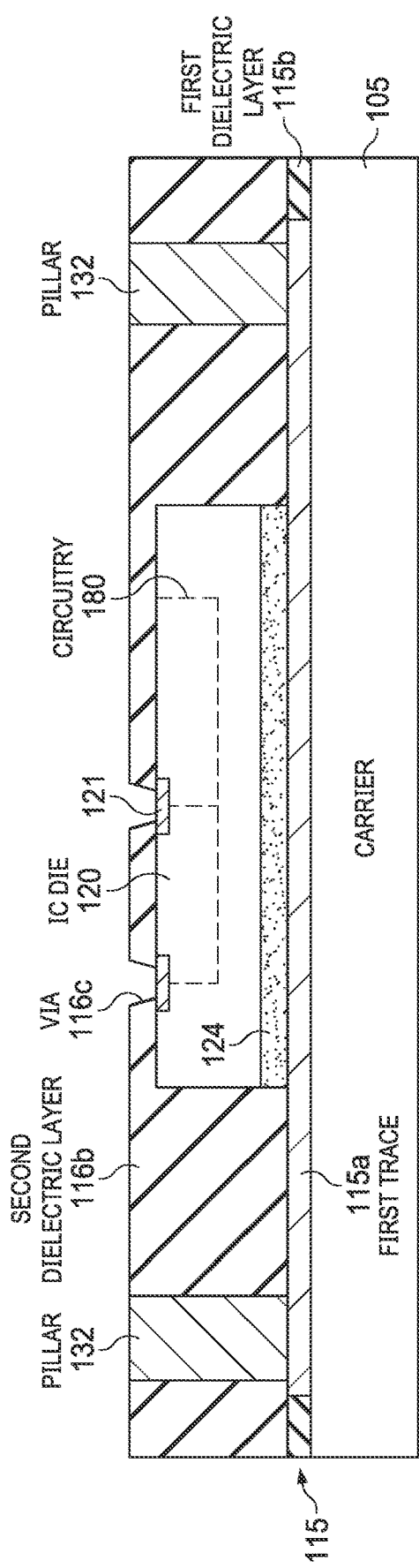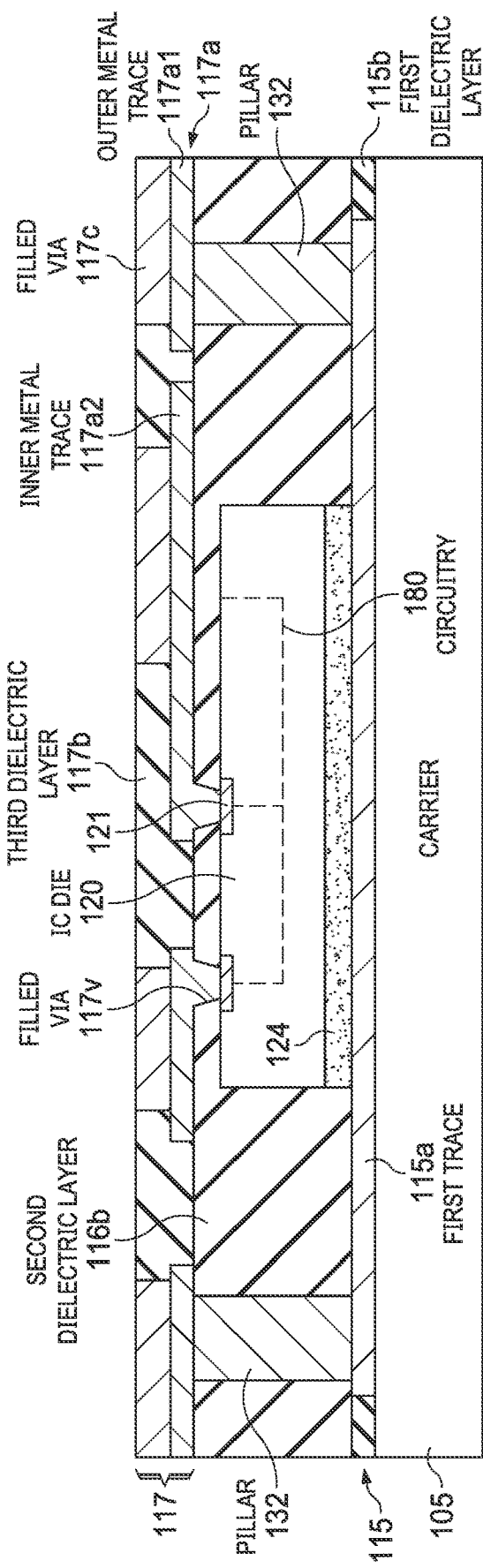
FIG. 1E
FIG. 1F

SEMICONDUCTOR PACKAGE WITH ELECTROMAGNETIC INTERFERENCE SHIELDING

CROSS-REFERENCE TO RELATED APPLICATIONS

The present application is a continuation of U.S. patent application Ser. No. 17/246,115, filed on Apr. 30, 2021, the entirety of which is incorporated herein by reference.

FIELD

This disclosure relates to electromagnetic shielding for semiconductor packages that include at least one integrated circuit (IC).

BACKGROUND

A challenge faced by electronic designers when designing a semiconductor package that comprises at least one IC which is a precision and/or sensitive IC, or includes precision and/or sensitive components, is electromagnetic interference (EMI) from neighboring electronic components. The precision and/or sensitive components can comprise a power metal oxide semiconductor field effect transistor (power MOSFET), a controller/driver, and analog-to-digital converter (ADC), digital circuitry, control and compensation circuitry, a digital-to-analog converter (DAC), or protection and diagnostic circuitry. The neighboring electronic components causing the EMI can comprise an IC or a discrete device such as an inductor. Because most electronic components during their operation emit at least some EMI, having precision and/or sensitive ICs in proximity to an EMI emitting electronic component(s) can cause the performance of the precision or sensitive IC to suffer.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize precision and/or sensitive ICs can have their performance affected by EMI caused by generally any active circuit, and also by some passive devices such as inductors, when located in proximity to the IC. One specific example of an IC sensitive to EMI comprises an audio power amplifier IC, where the audio qualities, such as frequency response, gain, noise, and distortion can degrade in the presence of EMI. Examples of precision ICs that can experience degraded precision in the presence of EMI includes ADCs and DACs. Such precision and/or sensitive ICs, such as in the case of an automotive application, will generally be assembled on the same printed circuit board (PCB) along with other devices which may be EMI emitting.

For example, when a sensitive IC die is packaged in a traditional powerpad package (PWP) that includes gullwing leads, it is difficult to shield EMI emitted from neighboring EMI emitting devices from reaching the sensitive circuitry due to limited PWP design flexibility. Even if some EMI shielding is achieved by the PWP package, the relatively high inductance of gullwing leads with the wirebonds to the bond pads of the IC can significantly increase the ringing, and as a result reduces the EMI shielding effect provided by the PWP package.

Disclosed aspects utilize a multilevel package substrate sometimes referred to as a routable leadframe (RLF), to provide an EMI shielded semiconductor package so that the precision or sensitive IC to EMI can be fully embedded in the package substrate, including being shielded from EMI by metal layer(s) which will generally be grounded in their application (e.g., grounded to a ground terminal on a common PCB). Disclosed package substrates also provide reduced parasitics as compared to conventional semiconductor packages having bond wires including reduced inductance due to the absence of any bond wires.

In a typical application where a disclosed package substrate having a precision or sensitive IC die referred to herein as it being an EMI shielded semiconductor package is attached to pads of a PCB, the EMI shield comprises a top EMI shield comprising a first layer metal and a bottom EMI shield comprising another metal layer. The top and bottom EMI shields are connected together by metal pillars which are positioned beyond the area of the precision or sensitive IC die. The respective EMI shields together with the metal pillars positioned beyond the area of the IC that can define an area beyond the area of the IC referred to herein as a ring around the IC, where the EMI shields together with the metal pillars collectively resemble a Faraday cage for the IC die.

The top EMI shield generally has an area greater than the area of the IC die, and is aligned to be over a full area of the IC. Metal pillars, such as comprising copper, are recognized to provide a low resistance vertical connection from the top metal layer of the package substrate to the bottom EMI shield, which can be provided by a PCB that the package substrate is mounted on. Alternatively, or in addition to a bottom EMI shield provided by the PCB, the inner metal traces of the package substrate can cover at least 50% of the area of the IC die to itself provide a bottom EMI shield.

Disclosed aspects include a semiconductor package comprising a multilayer package substrate including a first layer including a first dielectric layer and a first metal layer including at least a first metal trace and a second layer that includes a second dielectric layer. An IC die includes a semiconductor surface including circuitry, with nodes of the circuitry connected to bond pads. Metal pillars are through the second dielectric layer connecting to the first metal trace. A third layer on the second layer includes a third dielectric layer extending to a bottom side of the semiconductor package, a second metal layer including a plurality of second metal traces comprising inner second metal traces connected to the bond pads and outer second metal traces over the metal pillars, as well as filled vias through the third dielectric layer providing externally accessible contact pads that connect the second metal traces to a bottom side of the semiconductor package.

BRIEF DESCRIPTION OF THE DRAWINGS

Reference will now be made to the accompanying drawings, which are not necessarily drawn to scale, wherein:

FIG. 1A-G are successive cross-section views of an in-process EMI shielded semiconductor package comprising a precision or sensitive IC embedded within a multilayer package substrate corresponding to results following steps in an example method for forming an EMI shielded semiconductor package, according to an example aspect. FIG. 1A shows in-process results after forming a first layer on a carrier comprising a first metal trace that is embedded in a first dielectric layer. FIG. 1B shows in-process results after attaching an IC die including circuitry connected to bond pads with its top side up using a die attach material over the first trace. FIG. 1C shows in-process results after forming metal pillars on the first metal trace lateral to the IC die. FIG. 1D shows in-process results after forming a second dielectric layer, and then generally a grinding process to expose a top surface of the metal pillars. FIG. 1E shows in-process results after generally a drilling process through the second dielectric layer over the bond pads to reach the bond pads.

FIG. 1F shows in-process results after forming a third layer on the second layer including a third dielectric layer extending to a bottom side of the semiconductor package, and a second metal layer including a plurality of second metal traces comprising inner second metal traces over the area of the IC die, and outer second metal traces positioned beyond the area of the IC die, and forming filled vias. The filled vias provide externally accessible contact pads that connect the second metal traces to a bottom side of the semiconductor package. FIG. 1G shows in-process results after removing the carrier and flipping the semiconductor package, and then generally a sawing process in the typical case of a panel of EMI shielded semiconductor packages to provide a plurality of singulated EMI shielded packages.

In FIG. 3B, the PCB is also shown with its dielectric having embedded filled vias connected to metal pads.

DETAILED DESCRIPTION

Figure 1A:
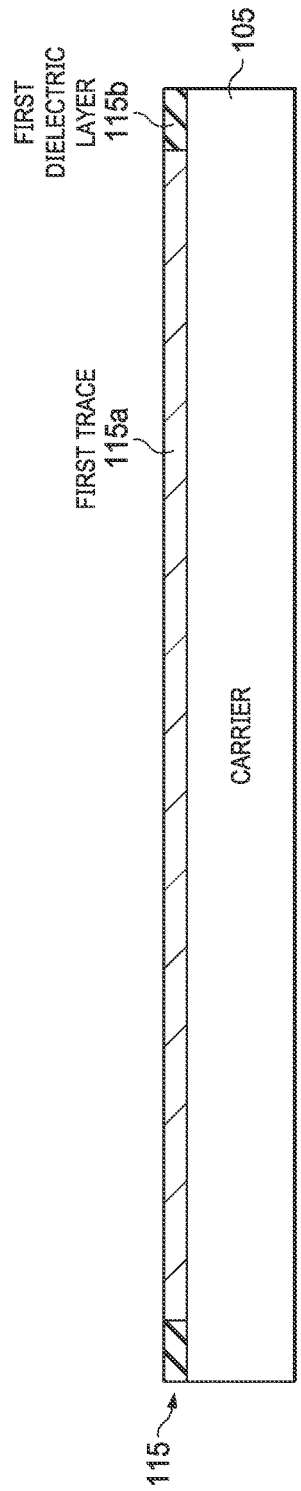

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitic s in the pathway, or through an indirect electrical connection via intervening items including other devices and connections. For indirect connecting, the intervening item generally does not modify the information of a signal but may adjust its current level, voltage level, and/or power level.

Several terms used herein will now be defined. A multilayer package substrate as used herein is a particular package substrate arrangement that comprises a plurality (at least two) of stacked layers where each layer is pre-configured with metal plating such as copper plating or interconnects to provide electrical connections in the package. Such a package substrate is generally built by forming a dielectric layer such as a mold compound (generally comprising an epoxy material) or other dielectric organic compound(s) around a leadframe substrate comprising a metal material between a patterned top metal layer and a patterned metal bottom layer. Such package substrates can comprise single-die or multi-die configurations, both lateral and vertically stacked, enabling low-profile and fine-pitch packages, which enable different stackups, materials, and manufacturing processes that have recognized benefits when applied to disclosed aspects.

An IC die as used herein comprises a substrate having at least a semiconductor surface (generally an all-semiconductor substrate, such as comprising silicon having an optional epitaxial layer thereon), where there were circuit elements (including transistors, and generally diodes, resistors, capacitors, etc.) formed in the semiconductor surface that are configured together for generally realizing at least one circuit function. Various nodes of the circuitry are connected to bond pads on the top side of the IC, where the bond pads generally comprise the top layer metal for the IC. The IC can comprise a power device such as an amplifier or a power regulator.

FIGS. 1A-G are successive cross-section views of an in-process EMI shielded semiconductor package comprising a precision or sensitive IC embedded within a multilayer package substrate corresponding to results following steps in an example method for forming an EMI shielded semiconductor package. FIG. 1A shows in-process results after forming a first layer 115 on a carrier 105 (such as a metal carrier) comprising a first metal layer shown including a first metal trace 115a that is embedded in a first dielectric layer 115b that can comprise a mold compound. The first metal trace 115a upon a conclusion of the method provides what will be a top EMI shield for an IC below. Although the first metal trace 115a is shown as a continuous structure that covers an entire area of the IC die 120, the first metal trace 115a can also be a patterned structure that includes gaps so that it does not covers all of the area of the IC die.

Figure 1B:
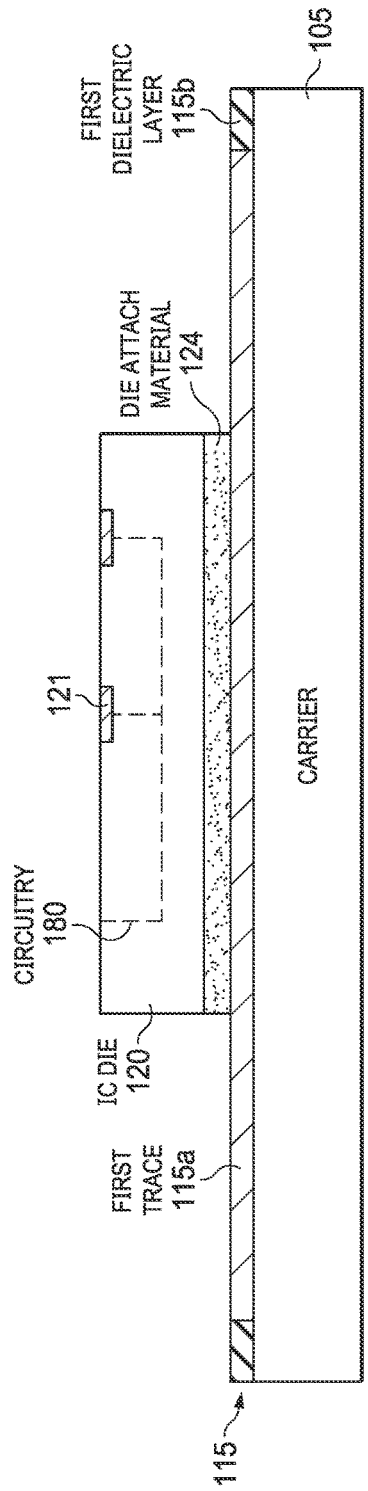

FIG. 1B shows in-process results after attaching an IC die 120 including circuitry 180 connected to bond pads 121 with its top side up using a die attach material 124 to attach the bottom side of the IC die 120. The die attach material 124 can comprise a dielectric material or can comprise an electrically and thermally conductive material, such as an epoxy with silver particles or solder.

For example, in the case of a dielectric die attach material, the die attach material 124 can comprise a die attach film (DAF) on the first metal trace 115a. The circuitry 180 for the IC die comprises circuit elements (including transistors, and generally diodes, resistors, capacitors, etc.) that may be formed in the epitaxial layer on a bulk substrate material, where the circuitry 180 is configured together for generally realizing at least one circuit function. Example circuit functions include analog (e.g., amplifier or power converter), radio frequency (RF), digital, or non-volatile memory functions.

FIG. 1C shows in-process results after forming metal pillars 132 on the first metal trace 115a positioned lateral to the IC die 120. The metal pillars 132 generally comprise copper, and have a height that extends above the top side surface of the IC die 120. A plating process can be used for forming the metal pillars 132. The metal pillars 132 can in one arrangement have a rectangular prism shape, which is defined as a 3-dimensional solid shape which has six faces that are all rectangles. In addition, the metal pillars 132 can generally have a variety of other shapes such as cylindrical, where the shape of the metal pillars 132 that can generally be designed depending on a given application.

Figure 2:
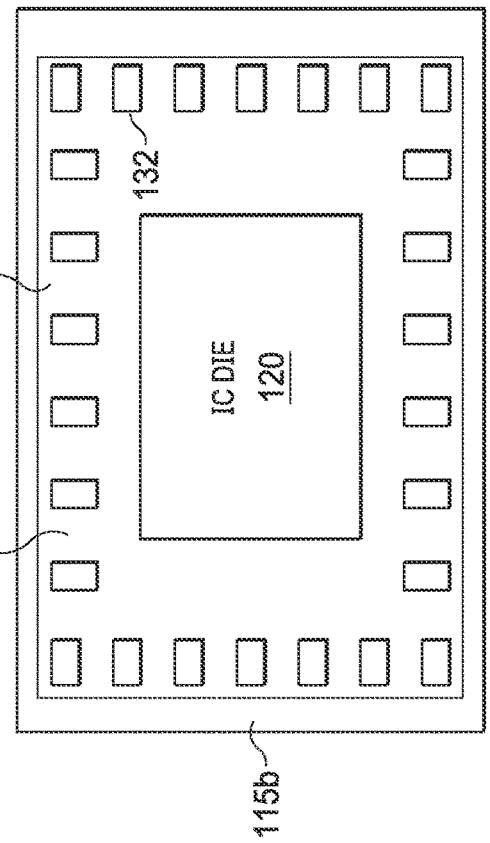
FIG. 2 is a top view corresponding to the structure shown in FIG. 1C which as described above shows in-process results after forming metal pillars on the first trace lateral to the IC die, according to an example aspect.

Although a plurality of spaced apart metal pillars 132 are generally formed, such as depicted in FIG. 1C and FIG. 2 described below, it may also be possible for instead of a plurality of spaced apart metal pillars 132, a continuous (single) metal ring can be formed around the IC die 120. In the case of spaced apart metal pillars 132, a nominal spacing can be 0.5 mm±20%. Again, in the case spaced apart metal pillars 132, the metal pillars 132 can collectively cover 10% to 40% of the area around the IC die 120. Regarding the gap between the adjacent metal pillars 132, the gap is generally a minimum of 0.1 mm, and a maximum which can depend on the IC die size. An area for the metal pillars 132 can be 0.05 mm$^2$ and 2 mm$^2$.

FIG. 1D shows in-process results after forming a second dielectric layer 116b, such as using a molding process to form a mold compound, and then grinding to expose a top surface of the metal pillars 132. FIG. 1E shows in-process results after forming vias 116c through the second dielectric layer 116b, such as using laser drilling, where the vias 116c are positioned over the bond pads 121. The vias 116c reach a top surface of the bond pads 121 to enable making a contact to the bond pads 121 as described below.

FIG. 1F shows in-process results after forming a third layer 117 on the second layer including a second metal layer 117a including a plurality of second metal traces comprising outer metal traces 117a1 that each connect to a metal pillar 132, and inner metal traces 117a2 that included vertical section that fills the vias 116c shown in FIG. 1E to form filled vias 117v that connect to the bond pads 121. The third layer 117 also includes a third dielectric layer 117b, such as comprising a mold layer, and filled vias 117c that provide externally accessible contact pads that connect the second metal traces to a bottom side of the semiconductor package shown at the top of FIG. 1F, that has second filled vias 117c embedded therein that contact the inner metal traces 117a2 and the outer metal traces 117a1.

Although not shown, the method can further comprise forming a fourth layer on the third layer 117. In one arrangement fourth layer is essentially identical to the third layer, and the metal traces of the fourth layer are aligned to the outer metal traces 117a1 in the inner metal traces 117a2. Advantages to forming this fourth layer can be better thermal performance and PCB level reliability, where is the fourth layer used for the connection to the PCB.

Figure 1G:
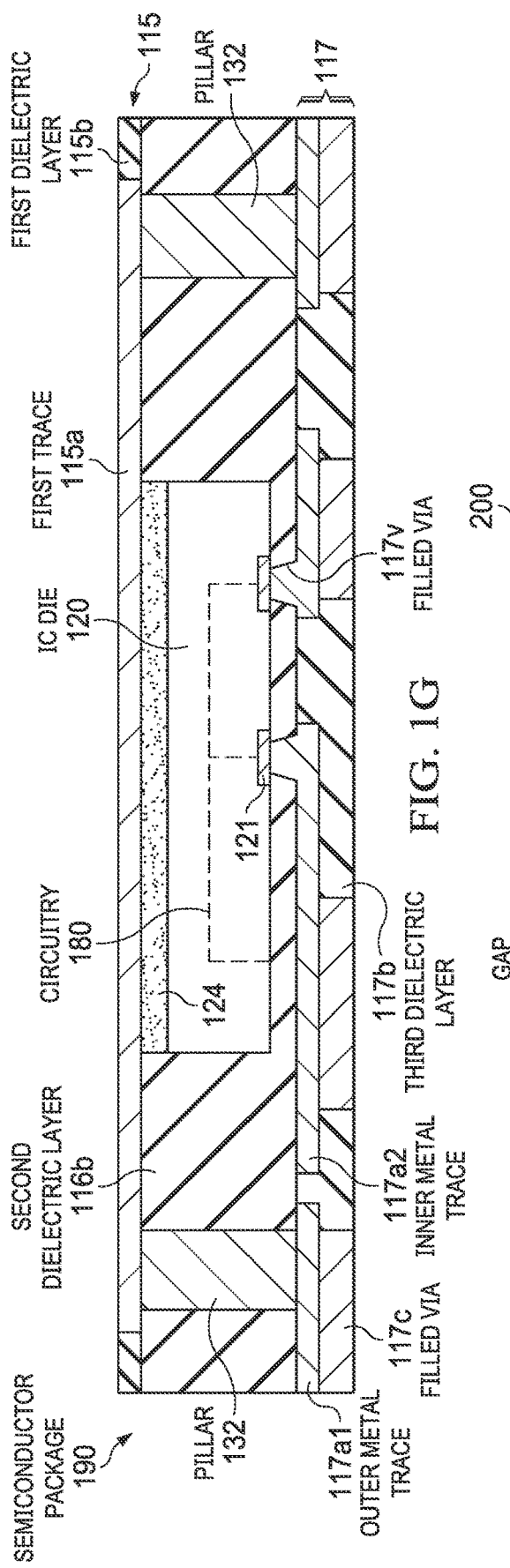

FIG. 1G shows in-process results after removing the carrier 105 and flipping the in-process package substrate, and then singulation generally comprising a sawing process in the typical case of a panel of EMI shielded semiconductor packages to provide a plurality of singulated EMI shielded semiconductor packages shown as an EMI shielded semiconductor package 190. After removing the carrier 105, there may be a surface finish treatment before the singulation. A total thickness of the EMI shielded semiconductor package 190 may be 350 μm to 600 μm, such as about 450 μm. The metal pillars 132 may have a height that is between 50% and 90% of the total thickness of the EMI shielded semiconductor package 190.

FIG. 2 is a top view 200 corresponding to the structure shown in FIG. 1C which as described above shows in-process results after forming metal pillars 132 on the first metal trace 115a lateral to the IC die 120, according to an example aspect. There can be seen to be gaps 133 between neighboring metal pillars 132. Although shown having a rectangular cross-section, the metal pillars 132 as described above can also have other shapes including a circular cross-section or other elliptical cross-section.

Figure 3A:
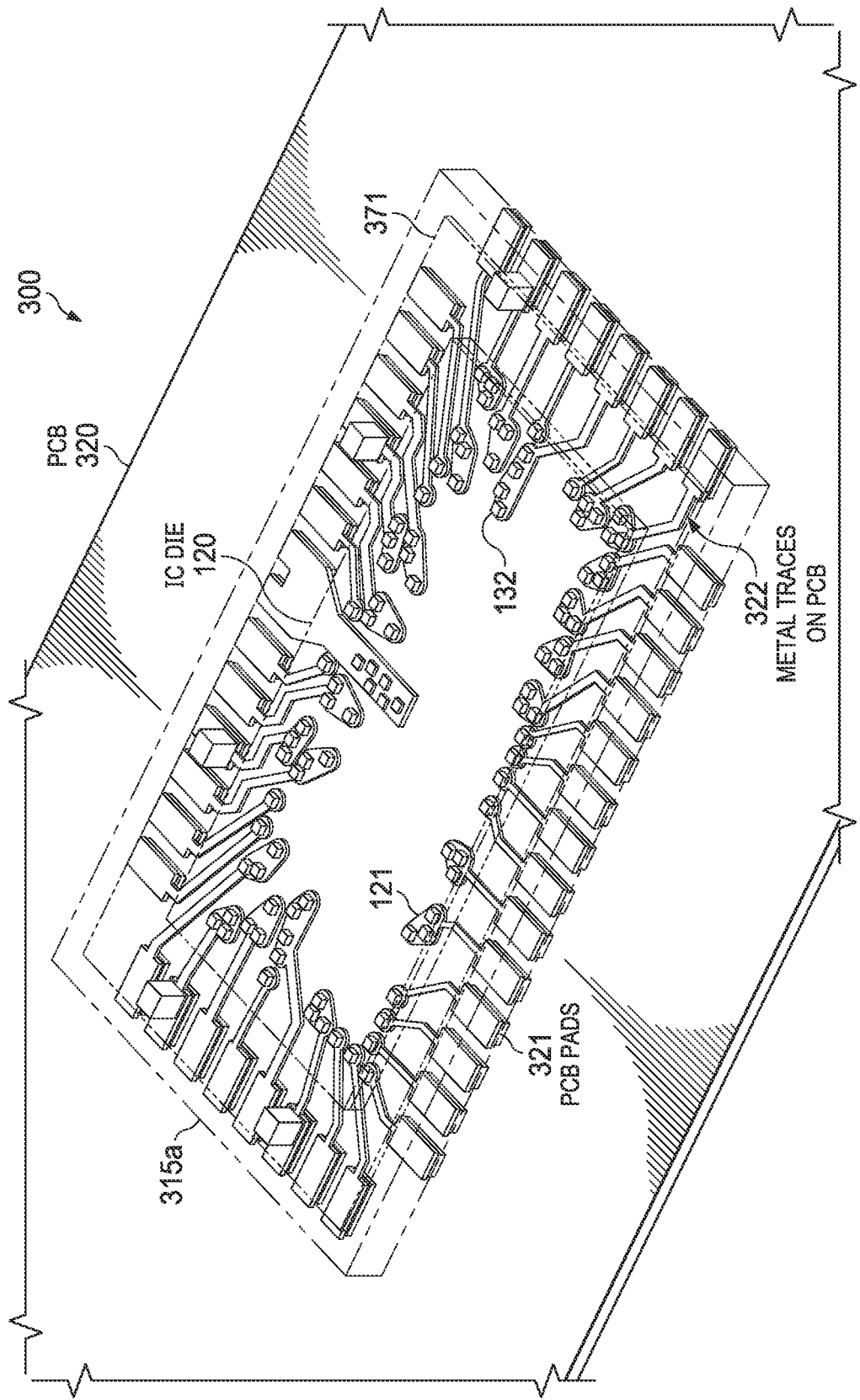
FIG. 3A and FIG. 3B show a top perspective view and a cross-sectional view, respectively, of a semiconductor package assembly comprising disclosed EMI shielded semiconductor package comprising an IC embedded within a package substrate mounted on pads on a top of a PCB that provides a bottom metal shield for the IC, according to an example aspect.
Figure 3B:
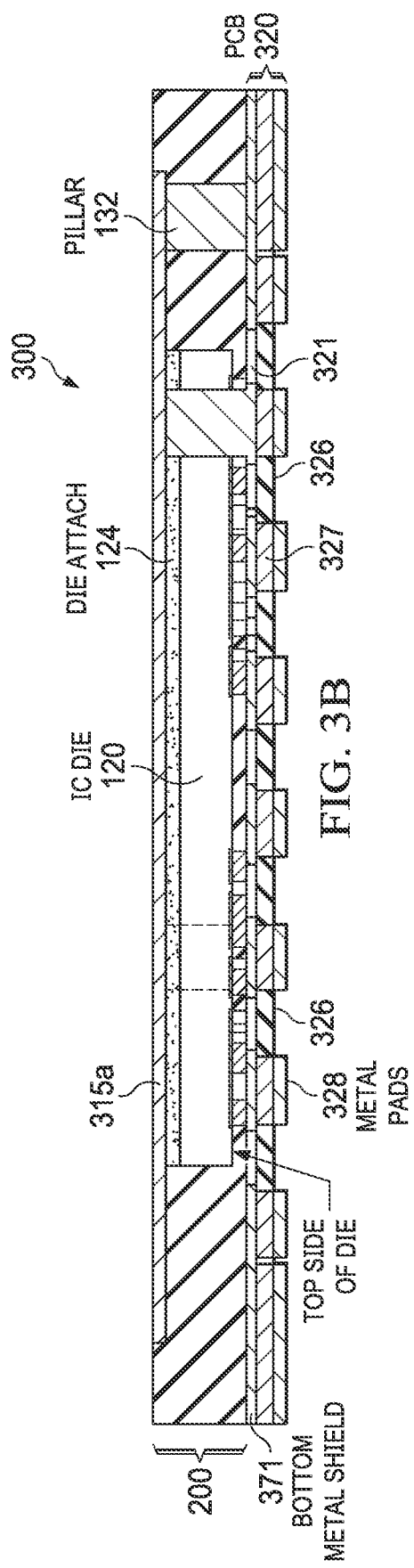

FIG. 3A and FIG. 3B show a top perspective view and a cross-sectional view, respectively, of a semiconductor package assembly 300 comprising a disclosed EMI shielded semiconductor package comprising an IC die 120 (such as the EMI shielded semiconductor package 190 shown in FIG. 1G described above) embedded within a package substrate mounted on pads 321 on a top surface of a PCB 320 that provides a bottom metal shield 371 for the IC die 120 that is shown covering an entire area of the IC die 120. There is a top metal EMI shield shown as 315a above the IC die 120, which corresponds to first metal trace 115a described above. Metal traces on the PCB 320 are shown as 322. In FIG. 3B, the PCB 320 is also shown with its dielectric layer 326 having embedded filled vias 327 connected to metal pads 328.

EXAMPLES

Disclosed aspects are further illustrated by the following specific Examples, which should not be construed as limiting the scope or content of this Disclosure in any way.

An EMI simulation was run to compare results from a conventional fused Thin Shrink Small Outline Package (TSSOP) versus a disclosed EMI shielded device. The TSSOP is a rectangular surface mount plastic IC package with gull-wing leads. The electric field data evidenced that a disclosed package substrate including EMI shielding reduces an electric field by a factor of three (from 30 V/m to 10 V/m) received on the top surface of the IC die as compared to a conventional fused TSSOP.

Disclosed aspects can be integrated into a variety of assembly flows to form a variety of different semiconductor packages and related products. The semiconductor package can comprise single IC die or multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

What is claimed is:
1. A semiconductor package, comprising:
a first layer including a first dielectric layer and a first metal layer;
an integrated circuit (IC) die including circuitry and bond pads connected to the circuitry on a first side of the IC die, a second side of the IC die opposite the first side attached to the first metal layer;
a second layer with a second dielectric layer on the first dielectric layer, the second layer including filled vias formed on the bond pads, the second dielectric layer at least partially covering the IC die;
conductive pillars connected to the first metal layer and extended through the second dielectric layer; and a third layer on the second layer including a third dielectric layer and a second metal layer with a first plurality of second metal traces connected to the bond pads through the filled vias and a second plurality of second metal traces connected to the conductive pillars.

2. The semiconductor package of claim 1, wherein:
the first metal layer has a first footprint; and
the IC die has a second footprint less than the first footprint, the second footprint being surrounded by an outer perimeter of the first footprint.

3. The semiconductor package of claim 1, further comprising:
a first set of filled vias in the third layer, the first set of filled vias being externally accessible and connected to the first plurality of second metal traces; and
a second set of filled vias in the third layer, the second set of filled vias being externally accessible and connected to the second plurality of second metal traces.

4. The semiconductor package of claim 1, further comprising:
a die attach material disposed between the second side of the IC die and the first metal layer.

5. The semiconductor package of claim 1, wherein the conductive pillars comprise respective unitary structures, each extending from a same surface of the first metal layer to which the second side of the IC die is attached, through the second dielectric layer to the third layer.

6. The semiconductor package of claim 5, wherein the unitary structure of at least one of the conductive pillars extends from the same surface of the first metal layer to which the second side of the IC die is attached to a corresponding one of the second plurality of second metal traces of the third layer.

7. The semiconductor package of claim 5, wherein the unitary structure of at least one of the conductive pillars has a vertical dimension between the same surface of the first metal layer and the third layer that is the same as a vertical dimension of a portion of the second dielectric layer adjacent the conductive pillar and between the same surface of the first metal layer and the third layer.

8. A semiconductor package assembly, comprising:
a semiconductor package, comprising:
a first layer including a first dielectric layer and a first metal layer;
an integrated circuit (IC) die including circuitry and bond pads connected to the circuitry on a first side of the IC die, a second side of the IC die opposite the first side attached to the first metal layer;
a second layer with a second dielectric layer on the first dielectric layer, the second layer including filled vias formed on the bond pads, the second dielectric layer at least partially covering the IC die;
conductive pillars connected to the first metal layer and extended through the second dielectric layer; and
a third layer on the second layer including a third dielectric layer and a second metal layer with a first plurality of second metal traces connected to the bond pads through the filled vias and a second plurality of second metal traces connected to the conductive pillars; and
a printed circuit board (PCB), wherein the semiconductor package is bonded onto a surface of the PCB, and wherein the surface of the PCB provides a first metal electromagnetic interference (EMI) shield for the semiconductor package assembly.

9. The semiconductor package assembly of claim 8, wherein:
the first metal layer has a first footprint; and
the IC die has a second footprint less than the first footprint, the second footprint being surrounded by an outer perimeter of the first footprint.

10. The semiconductor package assembly of claim 8, further comprising:
a first set of filled vias in the third layer, the first set of filled vias being externally accessible and connected to the first plurality of second metal traces; and
a second set of filled vias in the third layer, the second set of filled vias being externally accessible and connected to the second plurality of second metal traces.

11. The semiconductor package assembly of claim 8, further comprising:
a die attach material disposed between the second side of the IC die and the first metal layer.

12. The semiconductor package assembly of claim 8, wherein the conductive pillars comprise respective unitary structures, each extending from a same surface of the first metal layer to which the second side of the IC die is attached, through the second dielectric layer to the third layer.

13. The semiconductor package assembly of claim 12, wherein the unitary structure of at least one of the conductive pillars extends from the same surface of the first metal layer to which the second side of the IC die is attached to a corresponding one of the second plurality of second metal traces of the third layer.

14. The semiconductor package assembly of claim 12, wherein the unitary structure of at least one of the conductive pillars has a vertical dimension between the same surface of the first metal layer and the third layer that is the same as a vertical dimension of a portion of the second dielectric layer adjacent the conductive pillar and between the same surface of the first metal layer and the third layer.

15. The semiconductor package assembly of claim 8, wherein the first metal EMI shield is connected to a ground terminal of the semiconductor package assembly.

16. The semiconductor package assembly of claim 8, wherein the semiconductor package assembly does not include bond wires.

17. The semiconductor package assembly of claim 8, wherein the first metal layer, the conductive pillars, and the surface of the PCB providing the first metal EMI shield collectively form a Faraday cage arrangement for the IC die, with the first metal layer providing an additional metal EMI shield that is interconnected with the first metal EMI shield by the conductive pillars in the Faraday cage arrangement.

18. A method of assembling a semiconductor package, comprising:
forming a first layer on a carrier, the first layer including a first dielectric layer and a first metal layer;
attaching an integrated circuit (IC) die, the integrated circuit die including circuitry and bond pads connected to the circuitry on a first side of the IC die, to the first metal layer at a second side of the IC die opposite the first side;
forming conductive pillars connected to the first metal layer;
forming a second layer with a second dielectric layer on the first dielectric layer, the second layer including filled vias formed on the bond pads, the second dielectric layer at least partially covering the IC die, the conductive pillars extending through the second dielectric layer; and
forming a third layer on the second layer, the third layer including a third dielectric layer and a second metal layer with a first plurality of second metal traces connected to the bond pads through the filled vias and a second plurality of second metal traces connected to the conductive pillars.

19. The method of claim 18, wherein:
the first metal layer has a first footprint; and
the IC die has a second footprint less than the first footprint, the second footprint being surrounded by an outer perimeter of the first footprint.

20. The method of claim 18, further comprising:
forming a first set of filled vias in the third layer, the first set of filled vias being externally accessible and connected to the first plurality of second metal traces; and
forming a second set of filled vias in the third layer, the second set of filled vias being externally accessible and connected to the second plurality of second metal traces.

21. The method of claim 18, wherein attaching the IC die at the second side thereof to the first metal layer comprises attaching the IC die utilizing a die attach material disposed between the second side of the IC die and the first metal layer.

22. The method of claim 18, wherein the conductive pillars comprise respective unitary structures, each extending from a same surface of the first metal layer to which the second side of the IC die is attached, through the second dielectric layer to the third layer.

23. The method of claim 22, wherein the unitary structure of at least one of the conductive pillars extends from the same surface of the first metal layer to which the second side of the IC die is attached to a corresponding one of the second plurality of second metal traces of the third layer.

\* \* \* \* \*